United States Patent [19]
Wilson

[11] Patent Number: 5,309,014
[45] Date of Patent: May 3, 1994

[54] TRANSISTOR PACKAGE

[75] Inventor: Lance G. Wilson, Scottsdale, Ariz.

[73] Assignee: Motorola Inc., Schaumburg, Ill.

[21] Appl. No.: 862,106

[22] Filed: Apr. 2, 1992

[51] Int. Cl.$^5$ ............................................. H01L 23/02
[52] U.S. Cl. ..................................... 257/584; 257/587; 257/690
[58] Field of Search .............. 257/690, 691, 924, 580, 257/582, 584, 587

[56] References Cited

U.S. PATENT DOCUMENTS

| | | | |
|---|---|---|---|
| 4,649,416 | 3/1987 | Borkowski et al. | 257/703 |
| 5,216,279 | 6/1993 | Nakao | 257/690 |

Primary Examiner—Rolf Hille
Assistant Examiner—Roy Potter
Attorney, Agent, or Firm—Michael D. Bingham; Gary Hoshizaki

[57] ABSTRACT

A transistor package for use in common base linear, amplification applications includes a base flange member to which an insulating substrate is disposed wherein the bottom surface of the substrate is metalized to provide electrical contact to the flange member. Opposing ends of the substrate are edge metalized to conductively contact the bottom surface while the center portion of the top surface of the substrate has a selective metalized patterned formed therein and is isolated from the metalized opposing edges A metal bonding pad is formed centrally within the center portion and isolated therefrom to which the collector electrode of a transistor chip is die bonded. A lead frame comprising first and second opposing leads and a third lead adjacent to and parallel to the first lead is brazed to the center portion such that the first and second leads are insulated from the center portion while the third lead makes direct contact thereto. The emitter and collector electrodes are wire bonded to the first and second leads while the base electrode of the transistor is wire bonded to the metalized center portion of the substrate. One plate of a plurality of DC MOS blocking capacitors are bonded to the metalized edges with the other plate being wire bonded to the center portion to provide AC ground to the base electrode while isolating DC ground therefrom.

10 Claims, 2 Drawing Sheets

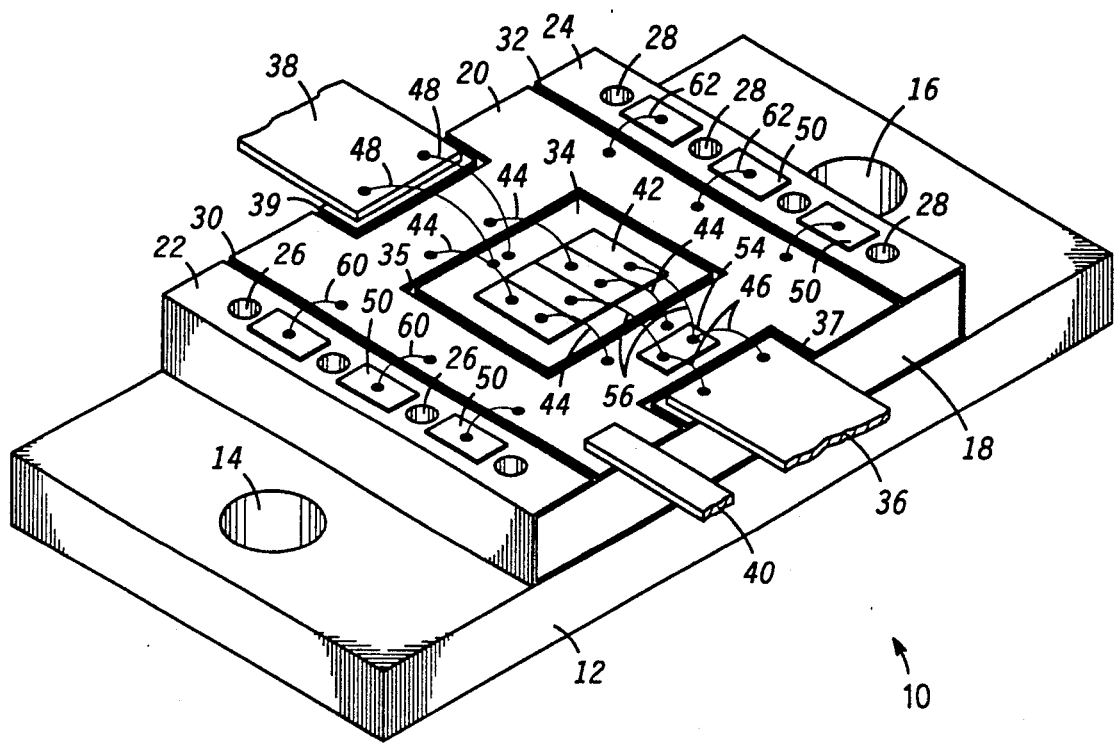
FIG. 3
FIG. 4
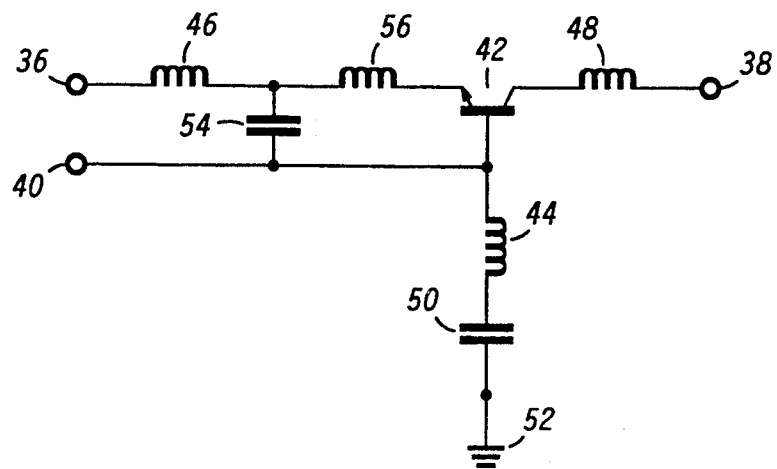

TRANSISTOR PACKAGE

FIELD OF THE INVENTION

Background of the Invention

The present invention relates to transistor packaging and, more particularly, to a radio frequency (RF) transistor package for providing a common base or gate device configuration.

Many present day common emitter operated devices for microwave RF linear applications do not have sufficient power, gain and efficiency to satisfy customer requirements. Common base configured devices, which lend themselves primarily to non-linear operation, may be able to meet most customer needs, however, they suffer from several disadvantages. For example, if forward biased linear operation is desired, the common base configured device has utilized a flange package which relied on mica or mylar films to form a base bypass capacitor to isolate the base of the transistor from DC bias while providing AC ground thereto. This technique has severe mechanical packaging problems which are not desirable.

Further, trying to bias the common base flange devices with a negative voltage on the emitter requires the bias supply to pass the entire emitter current and under compressed conditions the incoming RF drive signal will tend to reduced the effective bias on the device. Thus, the device is biased towards class C operation and not linear operation.

Hence, a need exists for a common base configured transistor package which overcomes the problems faced by prior art packaging techniques and which allows for linear operation of the transistor device.

SUMMARY OF THE INVENTION

A novel transistor package is provided which includes a metalized base flange member, an insulating substrate mounted to the base flange member and a lead frame disposed on the substrate. The insulating substrate includes coplanar top and bottom surfaces with the bottom surface being metalized to conductively contact the base flange member while the top surface has a metalization pattern formed thereon which includes selective opposing edges thereof being metalized to provide conductive contact to the bottom surface while the edges are electrically insulated from the center portion of the top surface of the substrate. The metalized center portion of the top surface of the substrate includes a metalized pad formed in the center thereof which is isolated from the surrounding area of the center portion and further includes first and second metalized bonding pads formed opposite one another in the center portion of the top surface while being isolated from the rest of the metalized center portion. A lead frame, which is mounted to the center portion of the substrate, includes first and second opposing leads which are brazed to and contacting the first and second bonding pads respectively and a third lead which contacts the center portion and is substantially parallel to the first lead.

BRIEF DESCRIPTION OF THE DRAWING

FIG. 3 is a perspective view of another transistor package of the present invention; and FIG. 4 is a simplified schematic representation of the package and transistor device of FIG. 3.

DETAILED DESCRIPTION OF THE PREFERRED EMBODIMENT

Figure 1:
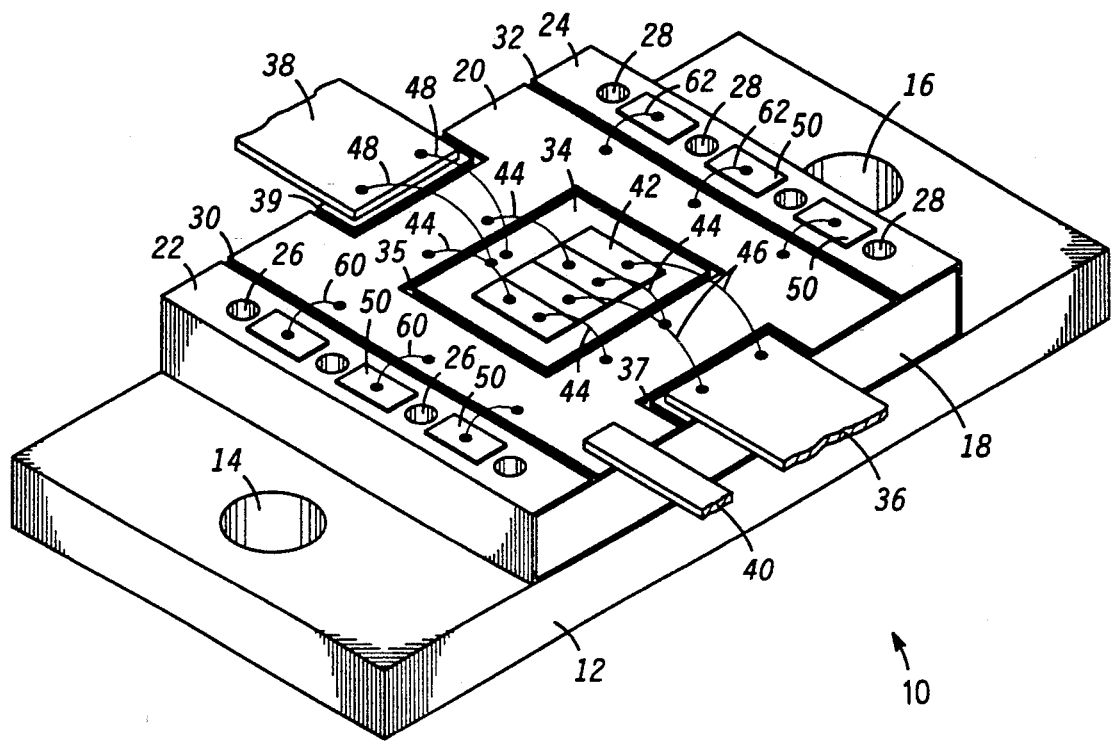
FIG. 1 is a perspective view of a transistor package which includes a transistor device disposed thereon.
Figure 2:
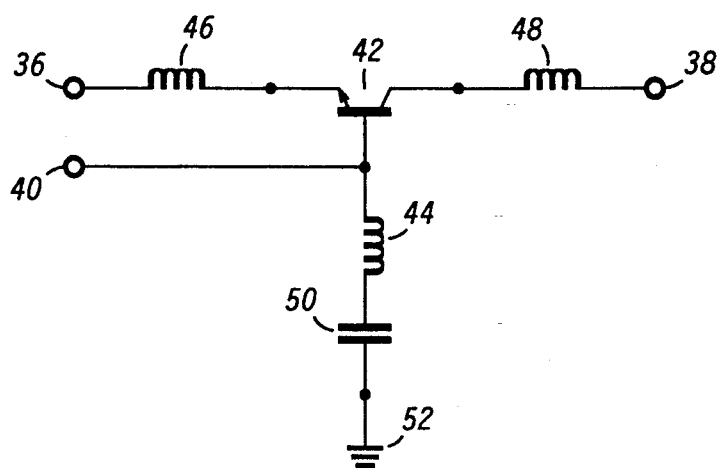
FIG. 2 is a simplified schematic representation of the transistor package of FIG. 1.

Referring to FIGS. 1 and 2, there is shown transistor package 10 for accommodating a transistor chip therein as will be explained. Transistor package 10 comprises flange base member 12 made of any suitable thermal conductive metal such as copper and which is typically gold plated. Base member 12 includes a pair of mounting holds 14 and 16 formed in the respective ends thereof. Isolating substrate 18, which is typically made of beryllium oxide (BeO) and is a generally rectangular form has substantially co-planar top and bottom surfaces. The bottom surface of substrate 18 which is metalized is bonded to the upper surface of base member 12 in a conventional manner. The top surface of substrate 18 has a selective metalized patterned formed thereon as will be explained. The opposing edges 22 and 24 are edge metalized as shown to conductively contact the bottom surface of substrate 18. Optionally, plated through holds 26 and 28 may be utilized to electrically contact edges 22 and 24 to the bottom surface of substrate 18. Non-metalized strip areas 30 and 32 insulate edges 22 and 24 from the metalized center portion 20 of substrate 18. Center portion 20 has a metalized pad 34 formed in the central area thereof which is isolated from the metalized center portion 20 by non-metalized strip 35 surrounding the pad. Similarly, first and second metalized bonding pads 37 and 39 are formed opposite one another in center portion 20 and are insulated therefrom A lead frame comprising leads 36, 38 and 40 is typically brazed to center portion 20 with leads 36 and 38 contacting pads 37 and 39 respectively while lead 40 is brazed to the metalized center portion 20 adjacent and parallel to lead 36. Substrate 18, although described as being of beryllium oxide, may be fabricated of any suitable thermally conductive and electrically insulating materials such as aluminum nitrite, sapphire or diamond to name a few.

Transistor package 10 provides a unique package for providing, for example, forward biased common base transistor operation. Thus, for instance, a transistor chip 42 may be die bonded to pad 34 in which the back side of the chip is its collector electrode while the base and emitter electrodes are disposed on the upper surface of the chip. It is understood that transistor chip 42 is shown for discussion purposes only and is not a true representation of an actual transistor chip. As shown, a plurality of wire bonds 46 contact the emitter electrodes to lead 36 which forms the external emitter lead of the common base transistor device. Likewise, a plurality of wire bonds 44 connect the base electrodes of the transistor chip to metalized center portion 20 to make direct electrical contact to the DC bias lead 40 while wire bonds 48 electrically connect the collector of transistor 42 to external collector lead 38 A plurality of MOS chip capacitors 50 having one plate thereof bonded to metalized edges 22 and 24 are contacted via wire bonds 60 and 62 to the metalized center portion 20 and form DC blocking capacitor.

FIG. 2 shows a simplified schematic diagram of the common base configured transistor package 10 wherein like components therein are referenced by the same reference numerals shown in FIG. 1. Wire bonds 60 and 62 are not shown for simplicity but would in fact be in series with bonds 44 between the base electrode of transistor 42 and combined capacitor 50. The package has the following features which are advantage over the prior art. Hence, AC bypassing for the base lead (base member 12) is now located within the package itself comprising capacitors 50. This provides a low inductance RF path to ground while the flange base member is the AC (RF) contact for the base of transistor and requires no insulators such as mica or mylar films that are required by the prior art. Package 10 also includes a fourth lead (lead 40) that is used only for DC forward biasing of transistor 42. Thus, the AC ground for the device is completely isolated from DC ground.

Although package 10 has been described as providing a common base configured transistor package it is well understood that package 10 may be used with a FET to provide a common gate device structure.

Turning to FIGS. 3 and 4 there is shown package 10 of FIG. 1 including input matching for the transistor device Input matching is provided by bonding MOS capacitor 54 to metalized center portion 20 between lead 36 and bonding pad 34. The emitter electrodes of transistor die 42 are connected via a plurality of wire bonds 56 and 46 to both capacitor 54 and emitter lead 46 as schematically shown in FIG. 4. Thus, by adjusting the number, lengths, etc. of wire bonds 46 and 56 as well as the capacitance of capacitor 54, the impedance at the emitter of transistor 42 can be matched to the input signal impedance that is applied at lead 36. Similarly, output matching can be realized by using a capacitor bonded to metalized center portion 20 between bonding pad 34 and collector lead 38 and wire bonding thereto in the same manner as discussed herein. It should be obvious from the foregoing that a push-pull or balanced common base configuration could be realized by extending flange member 12 in order to dispose an extended and/or two piece substrate 18 thereon having a plurality of center portions 20 formed on the substrate and isolated from one another to include a pair of transistor chips 42. In this configuration the bases of each transistor chip would be electrically coupled in common to the flange member through a plurality of MOS capacitor chips 50.

Thus, what has been described above, is a novel transistor package for RF application which allows configuration of a transistor device as a common base amplifier to be forward bias for linear operation. The package allows for internal placement of DC blocking capacitors to facilitate the forward biasing and includes a fourth separate lead for DC biasing only while isolating DC ground from AC ground.

I claim:
1. A transistor package, comprising:
a base flange member;
an insulating substrate having top and bottom substantially planar surfaces, said lower surface being electrically conductively mounted to said flange base member, said top surface having a predetermined metalization pattern formed thereon including selective opposing edges thereof being metalized to provide conductive contact to said bottom surface, said selective edges being electrically isolated from the metalized center portion of said top surface of said substrate, a metalized pad formed in said center portion and being insulated from the surrounding area of said metalized center portion and first and second metalized bonding pads formed opposite one another in said metalized center portion and being insulated therefrom; and
a lead frame mounted to said substrate including first and second opposing leads which contact said first and second bonding pads respectively while being isolated from said center portion and a third lead contacting said metalized center portion and being substantially parallel to said first lead.

2. The package of claim 1 including a plurality of MOS capacitors having one plate disposed on said selectively opposing edges and a second plate wire bonded to said metalized center portion of said substrate.

3. The package of claim 2 including a transistor disposed on said metalized pad formed in said metalized center portion of said substrate and having first and second main electrodes and a control electrode, said first main electrode being electrically contacted to said metalized pad, a first set of wire bonds contacting said first lead of said lead frame to said second main electrode, a second set of wire bonds contacting said control electrode to said metalized center portion and a third set of wire bonds contacting said second lead of said lead frame to said metalized pad.

4. The transistor package of claim 2 including a MOS capacitor disposed on said metalized center portion of said substrate between said metalized pad and said first lead of said lead frame.

5. The transistor package of claim 4 includes a transistor disposed on said metalized pad and having first and second main electrodes and a control electrode, a first set of wire bonds for electrically connecting said first main electrode of said transistor to said MOS capacitor disposed on said metalized center portion of said substrate and to said first lead, a second set of wire bonds for electrically connecting said control electrode to said second lead, and a third set of wire bonds for connecting said control electrode to said metalized center portion.

6. A common base transistor package, comprising:
a base flange member;
an insulating substrate having top and bottom substantially planar surfaces, said lower surface being electrically conductively mounted to said flange base member, said top surface having a predetermined metalization pattern formed thereon including selective opposing edges thereof being metalized to provide conductive contact to said bottom surface, said selective edges being electrically isolated from the metalized center portion of said top surface of said substrate, a metalized pad formed in said center portion and being insulated from the surrounding area of said metalized center portion and first and second metalized bonding pads formed opposite one another in said metalized center portion and being insulated therefrom;
a lead frame mounted to said substrate including first and second opposing leads which contact said first and second bonding pads respectively while being isolated from said center portion and a third lead contacting said metalized center portion and being substantially parallel to said first lead; and
a transistor having emitter, collector and base electrodes, said transistor being disposed on said metalized pad such that said collector makes contact therewith, said emitter electrode being coupled to said first lead, said collector electrode being coupled to said second lead and said base electrode being coupled to said metalized center portion.

7. The transistor package of claim 6 wherein said emitter electrode is wire bonded to said first lead, said collector electrode is connected to said second lead by wire bonds connecting said metalized pad to said second lead and said base electrode is wire bonded to said metalized center portion.

8. The transistor package of claim 7 including a plurality of MOS capacitors each having first and second plates wherein said first plates of a first set of said capacitors are electrically bonded to said first metalized opposing edge and said first plates of a second set of said capacitors being bonded to said second opposing metalized edge and said second plates being wire bonded to said metalized center portion of said substrate 9. A common base transistor package, comprising:
a base flange member;
an insulating substrate having top and bottom substantially planar surfaces, said lower surface being electrically conductively mounted to said flange base member, said top surface having a predetermined metalization pattern formed thereon including selective opposing edges thereof being metalized to provide conductive contact to said bottom surface, said selective edges being electrically isolated from the metalized center portion of said top surface of said substrate, a metalized pad formed in said center portion and being insulated from the surrounding area of said metalized center portion and first and second metalized bonding pads formed opposite one another in said metalized center portion and being insulated therefrom;
a lead frame mounted to said substrate including first and second opposing leads which contact said first and second bonding pads respectively while being isolated from said center portion and a third lead contacting said metalized center portion and being substantially parallel to said first lead;
a MOS capacitor having a first plate bonded to said metalized center portion between said metalized pad and said first lead and a second plate; and
a transistor having emitter, collector and base electrodes, said transistor being disposed on said metalized pad such that said collector makes contact therewith, said emitter electrode being coupled both to said first lead and said second plate of said MOS capacitor, said collector electrode being coupled to said second lead and said base electrode being coupled to said metalized center portion.

10. The transistor package of claim 9 including a plurality of MOS capacitors each having first and second plates wherein said first plates of a first set of said capacitors are electrically bonded to said first metalized opposing edge and said first plates of a second set of said capacitors being bonded to said second opposing metalized edge and said second plates being wire bonded to said metalized center portion of said substrate.

* * * * *